United States Patent [19]

Miller

[11] Patent Number: 5,011,366
[45] Date of Patent: Apr. 30, 1991

[54] ULTRACLEAN ROBOTIC MATERIAL TRANSFER METHOD

[76] Inventor: Richard F. Miller, 10905 Eureka St., Boca Raton, Fla. 33428

[21] Appl. No.: 386,971

[22] Filed: Jul. 31, 1989

[51] Int. Cl.⁵ .................................. B65G 1/10
[52] U.S. Cl. ..................... 414/786; 414/217; 414/331; 414/416; 414/225; 414/744.2; 414/752; 118/719; 901/40
[58] Field of Search ............ 414/222, 225, 226, 416, 414/417, 331, 744.8, 786, 744.2, 744.3, 627, 750, 751, 752, 753, 217; 118/719; 187/17; 901/40

[56] References Cited

U.S. PATENT DOCUMENTS

| | | | |
|---|---|---|---|
| 3,823,836 | 7/1974 | Cheney et al. | 414/331 X |
| 4,687,542 | 8/1987 | Davis et al. | 414/217 X |
| 4,746,256 | 5/1988 | Boyle et al. | 414/331 X |
| 4,808,059 | 2/1989 | Eddy | 414/416 |
| 4,917,556 | 4/1990 | Stark et al. | 414/217 |

FOREIGN PATENT DOCUMENTS 803867  11/1958  United Kingdom .................. 187/17

Primary Examiner—Frank E. Werner
Attorney, Agent, or Firm—Robert J. Van Der Wall

[57] ABSTRACT

An automatic wafer handling system utilizing a vacuum pneumatic controlled cable driving mechanism. In principle, the necessary movements are provided by air cylinder actuation of pulley supported cables. This application of vacuum force is substituted in place of positive air pressure, offering simplicity, reliability and stability by its use. Further advantages include the elimination of electric motor driving elements, thereby providing significant reduction of particulate and dust contamination problems. System operation includes the use of vacuum in the pickup of wafers, in manipulation and transport by cable drive, and motion control by means of air cylinders using negative air pressure.

4 Claims, 5 Drawing Sheets

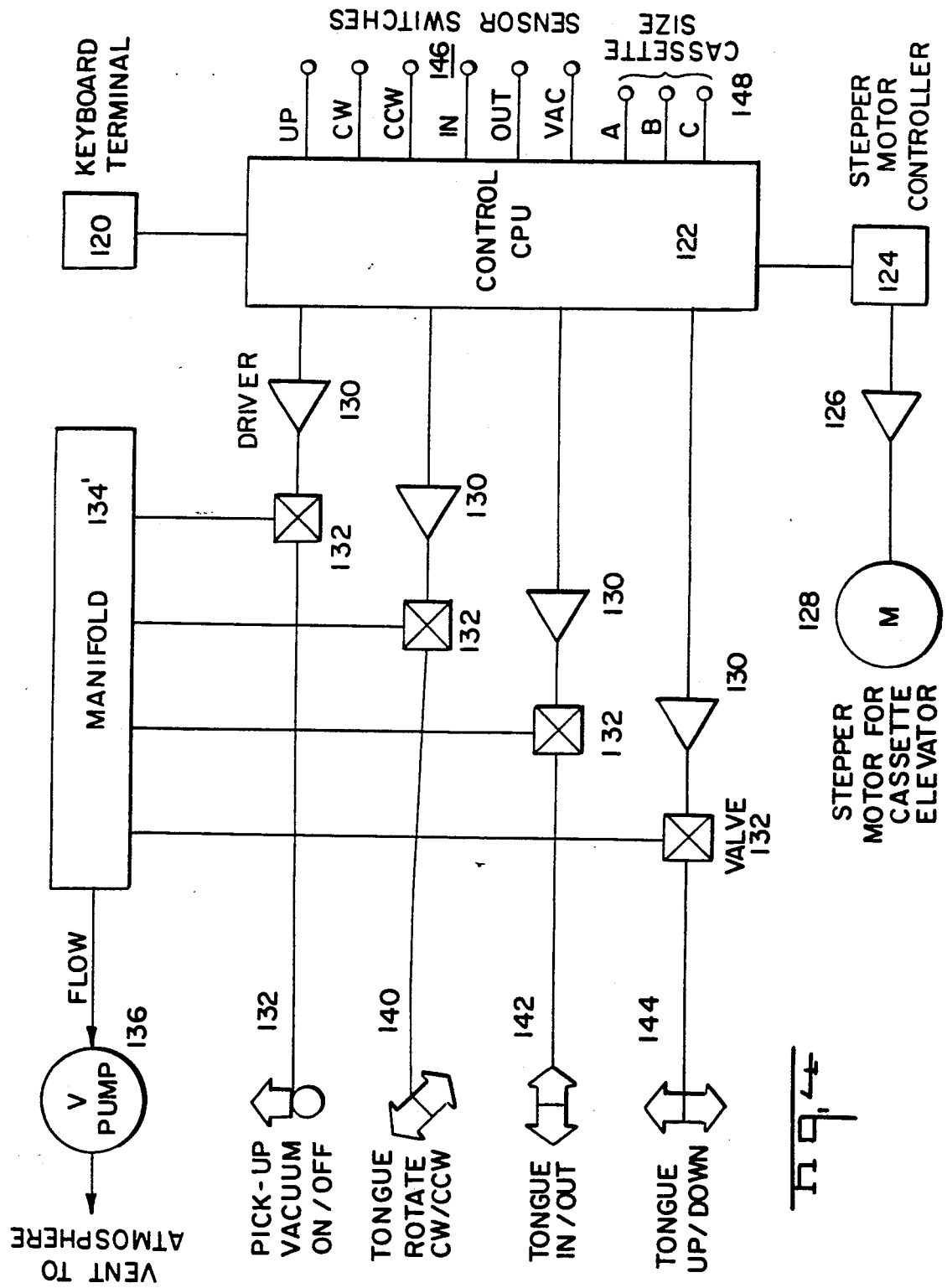

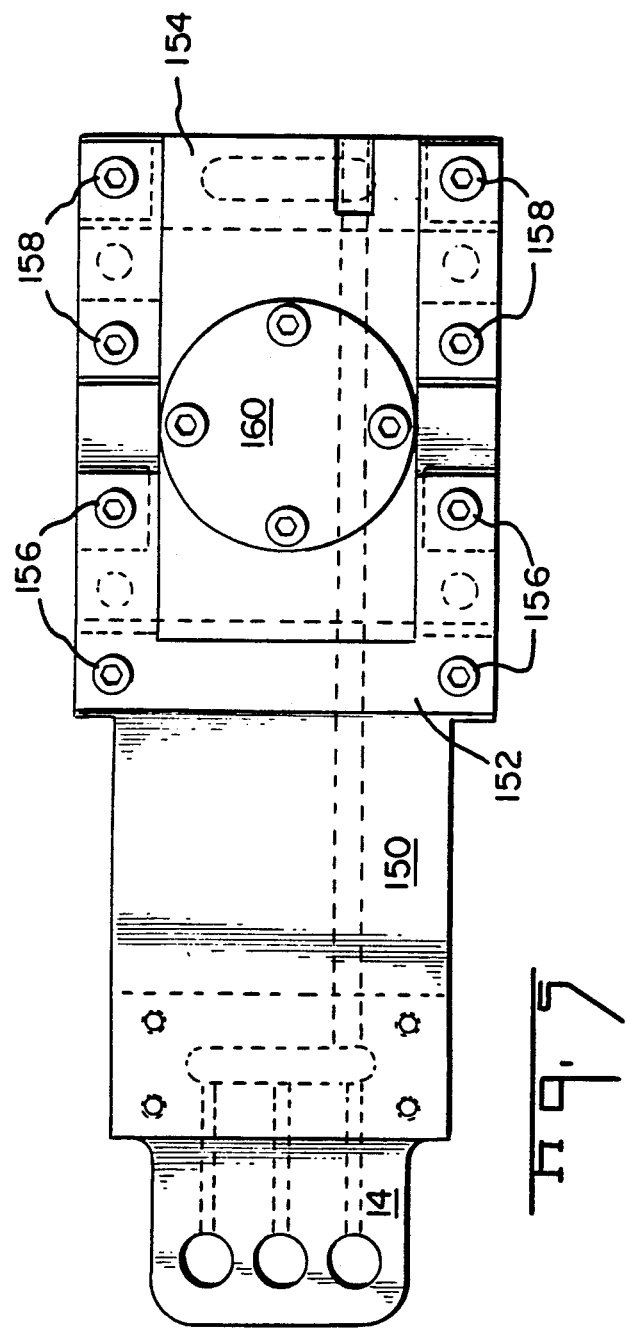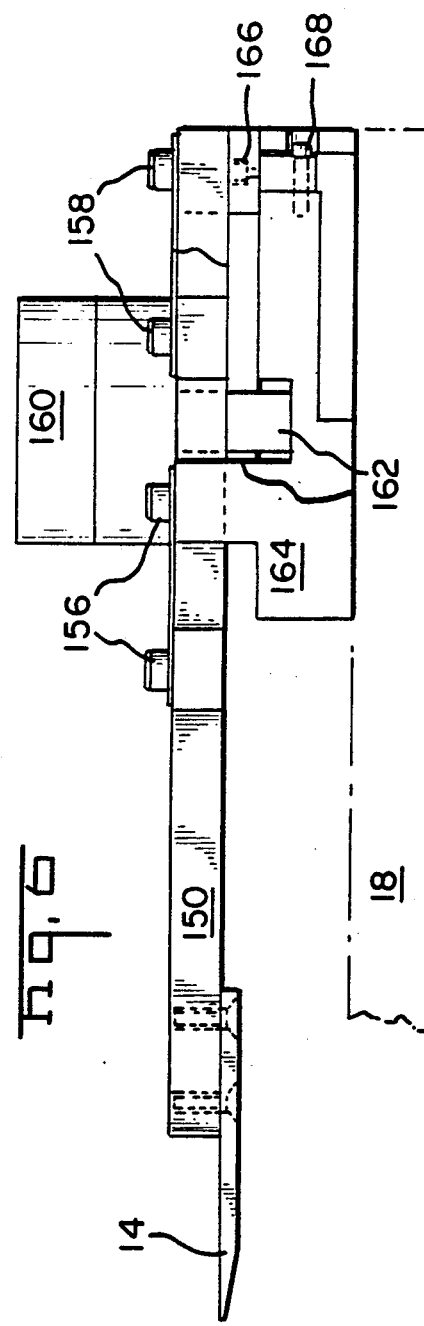

ULTRACLEAN ROBOTIC MATERIAL TRANSFER METHOD

FIELD OF THE INVENTION

This invention relates to precision, automatic handling and placement of objects or materials, such as semi-conductor wafers, between a storage location and an inspection station, particularly under ultraclean conditions.

BACKGROUND OF THE INVENTION

A new method is presented for use in the transfer of objects requiring ultraclean handling and accurate control in positioning. Involving the use of vacuum pneumatics, the method results in a wafer handling technique as described herein to minimize contamination and damage in a unique manner.

Wafer handlers are required to remove individual wafers from storage location (cassettes) and transport each in turn to a measurement, a treatment or an inspection station, without damage to its structure or surface finish, or particle contamination thereof.

A semiconductor wafer is a disc of polycrystalline silicon or other similar compound, which is utilized in the production of printed micro-circuits and the like. It must be handled in a virtually dust free and sterile environment, never touched by human hands or contaminated in any way. The wafers are highly fragile, being quite thin (of the order of 10 to 20 mils), of large diameter (3 to 8 inches) and easily damaged. They have highly polished faces and can be rendered useless due to particle contamination, scratch abrasion or other handling hazards. Because of many succeeding treatment processes, with repeated inspections, the need to minimize contamination and damage is mandatory.

To effect this task, several types of automatic machinery equipment have been developed, employing for the most part, electric motor drives and similar electro-mechanical components.

Wafer handlers operate by controlling the location of wafer discs from storage cassette to inspecting station. In actuality, the wafer handler removes each single wafer from the cassette and manipulates its transfer by rotation, translation and elevation control to a specific stage location. Microscopic inspection or other measurement can then be conducted as required. After performance of this task is completed, the handler automatically returns each wafer back to its storage cassette. All wafers within the cassette are repetitively manipulated throughout the program.

While earlier handlers employed direct human control, modern equipment is micro-processor controlled, providing the advantages of automation.

Presently, wafer handlers use a vacuum tongue for holding each wafer to guide positioning, with transport and locational action provided by an electric motor drive. While motor machinery suffices to move the wafers, there are major drawbacks and disadvantages in their use.

The electrical motor machinery presently in use employs gear trains and various other mechanical connections which are costly, complex and, most seriously, present a source of dust and particulate contamination. Motors require lubrication, generate heat and create some ozone through minute arcing of electricity, resulting in added hazards to wafer processing. Since wafers undergo repeated cycling of tests and treatments, control of exposures to such contamination is of paramount importance.

As noted above, wafer handlers operate by means of a vacuum tongue which holds each wafer during cassette removal and mechanical transfer. The various movements required are typically the following:

1. The tongue is advanced beneath the wafer and raised to contact the underside.
2. Vacuum is applied by a port in the tongue to hold the wafer which is withdrawn from the cassette.
3. Both tongue and captive wafer, after clearance from cassette, are rotated (by 90 or 180 degrees as specified) and transported to the inspection stage vicinity.
4. Tongue and wafer are then advanced and lowered or elevated to proper stage position.
5. The wafer holding device at the inspection station now captures the wafer, while the tongue is turned off and withdrawn to standby position.
6. After inspection or testing, the manipulation process is repeated in reverse sequence, replacing the wafer back within the cassette.

The prior art specifically includes wafer transport by use of stepper motors, cams, gear trains, trolleys and tracks, chain and sprocket driven conveyors, and similar conventional mechanisms. Some systems employ optical sensing for track alignment, mechanical switching for motor signalling, encoder measuring devices and positive pressure air controls.

In particular, Coad. et al. U.S. Pat. No. 4,311,427 uses a chain drive under stepper motor control, while a track like conveyor operates with a cassette which holds wafers in upright position.

Foulke. et al. U.S. Pat. No. 4,493,606 and 4,603,897 use an intricate optical sensing system in conjunction with stepper motor, cams, etc. for transport. A vacuum suction operated flat tongue element is employed only to hold wafers in position.

Still others have utilized similar electro-mechanical combinations. However, in all of the above applications of wafer handling, there is no technique described for transferring wafers or other material forms, by means of vacuum pneumatic driving forces in conjunction with moving cables.

This invention seeks to eliminate problems inherent in present electric motor uses for wafer handling systems, by substituting vacuum force control as the principal driving mode in the transport of wafer discs.

Normally, pneumatic air cylinders use positive pressure above ambient, to move piston and rod assemblies. When used as a driving force, residual air in the low pressure side of the cylinder is exhausted into the critical environmental atmosphere for the wafer handler. This causes contaminating particles to enter that atmosphere and is of utmost concern. For this reason such methods should not be used in wafer handling functions.

The present invention, however, inverts the pneumatic logic, using vacuum as a force to operate the motion actuators. Therefore, negative pressure (below ambient) provides piston drive while drawing air in from the clean room, which is later exhausted outside the critical atmosphere. Leaks or broken lines thus do not affect contamination levels.

This vacuum driving technique has been integrated into a system operation which utilizes the following major components to enable the inventive method:

1. A vacuum pump with force direction control valves,

2. Air cylinders with piston rod drivers,
3. Cable drive and pulley assemblies,
4. A series of sensor switches for positional control,
5. A slide arm and tongue wafer holder or support arm and translator base,
6. A cable surrounding and contacting drum cylinder, and
7. A cassette elevation control mechanism, In operation, a vacuum force is produced by the vacuum pump and utilized by means of directional control valves which exhaust air from either of the entry ports of the air cylinder. The resulting motion of piston and connecting rod of the cylinder are attached to and drive a cable over a pulley routed path. A series of sensor or limit switches direct the cable motion, which is imparted to a coupled slide and tongue wafer holder thereby providing slide translation over smooth rod supports. The smooth rod supports are rigidly held by a translator base assembly.

A second cable driving mechanism which surrounds and is coupled to a drum cylinder provides the rotation of the entire translator base holding the slide and tongue with wafer. Both cable mechanisms preferably use teflon coated cables, which are spring loaded to maintain close tolerance registration and minimizes contamination from the cables.

A cassette elevation control mechanism is operated linearly by a separate vacuum force cylinder.

System operation is directed by means of the microprocessor control unit via an R S 232 C communications device such as a standard terminal or computer serial output.

It is to be noted that reversed position seals in the air cylinders, as well as pneumatically operating cushions, are utilized within the system. The reversed seals are bi-directional double lipped, permitting control of rod motions in either direction. Operating cushions act to de-accelerate motion of the slide mechanism in both slide translation and rotation of translator base modes.

SUMMARY OF THE INVENTION

With the foregoing in mind, it is a principal object of the present invention to provide methods for automatically controlled wafer handling equipment by means of a vacuum pneumatic cable driving mechanism.

The use of a vacuum operated mechanism is clean, economical and reliable. In brief, vacuum powered cylinders drive pistons and rods directly connected to cables, which through pulley supported routing of paths, move a tongue and slide arm wafer support from storage to inspection stations. The driving circuit includes the use of solenoid activated valves which do not employ moving electrical parts and therefore, are substantially free of dust, ozone generation or other contaminants. Because valves operate on the vacuum side of the system, particle flow is vented outside of the system.

Thus, a principal object of the invention is to provide significant reduction in particle, dust and ozone contamination in an ultraclean room environment by means of a method enabled by a vacuum operated mechanism for wafer transfer.

A further object of improvement is the use of spring loaded, teflon coated cables. Their use compensates for wear and stretch, eliminating the need of gear teeth whose use can generate contamination, backlash, lose register and hence affect positional accuracy.

Another object of improvement is by means of a common base supporting plate which holds all components of the system, thus ensuring improved stability and greater reliability in performance.

It is yet another object of invention to permit the handling of various diameter wafers without requiring mechanical changes. The system operation includes the use of electro-mechanical switches which signal cassette size details to the processor, enabling the determination of proper wafer dimensions. This provides the limiting data for wafer pickup and other motion controls. The use of switches may be implemented by the inclusion of photoelectric sensors as needed, thereby indicating wafer presence or absence.

In summary, the invention as described above, teaches that a wafer disc or other material form, can be manipulated, transported, rotated and handled, by means of a vacuum control using air cylinders with negative force, and piston-rod connected cable drives.

Still further objects and advantages of the subject invention will become apparent as the following description proceeds and the features of novelty become apparent. This will be further characterized and described with particularity in the claims appended to this specification.

Additional robotic handling applications may be utilized in such diverse fields as:
Ceramic substrate manipulation
Audio and video disc preparation
Data storage, and retrieval disc processing
Biological slide transport control
Radioactive control processes A better understanding of the invention is given by reference to the following drawings.

BRIEF DESCRIPTION OF THE DRAWINGS

FIG. 3 gives a fluidic schematic of the vacuum operated wafer handler.

FIG. 4 is a pneumatic block diagram of the wafer handler.

FIG. 5 is a plan view of the vacuum powered lift mechanism.

FIG. 6 is a side elevational view of the vacuum powered lift mechamism.

DETAILED DESCRIPTION OF THE PREFERRED EMBODIMENT

Figure 1:
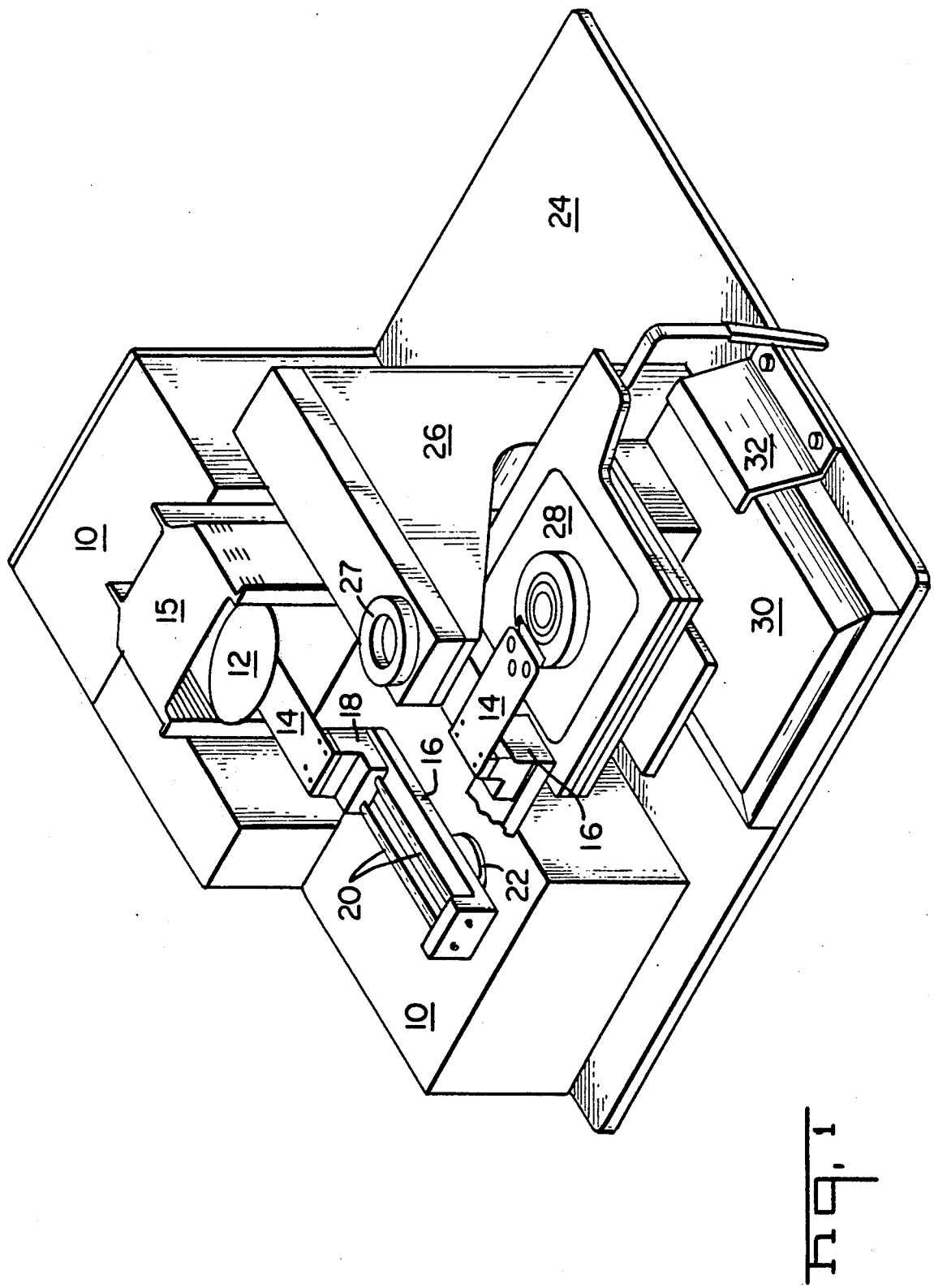
FIG. 1 is an isometric view of the wafer handler system.

FIG. 1 is an isometric view of the robotic wafer handler showing obvious external components only. Main housing 10 holds the air cylinder assembly cable and pulley components control valves and switches, and other functional devices not shown. Common base plate 24 holds the microscope 26 with its base 30, eyepiece 27, inspection stage 28, and angle support 32. A wafer 12, held by tongue (underneath) 14, is withdrawn from its cassette 15 by motion of the slide 18 along smooth rod supports 20. A cable within the translator base 16 which is attached to the slide 18, provides the motion control. Drum 22 which supports the translator base assembly, is caused to rotate ninety degrees by a second cable drive mechanism, thereby presenting the wafer at the inspection station 28. Only the tongue holder 14 is shown at this location.

Figure 2:
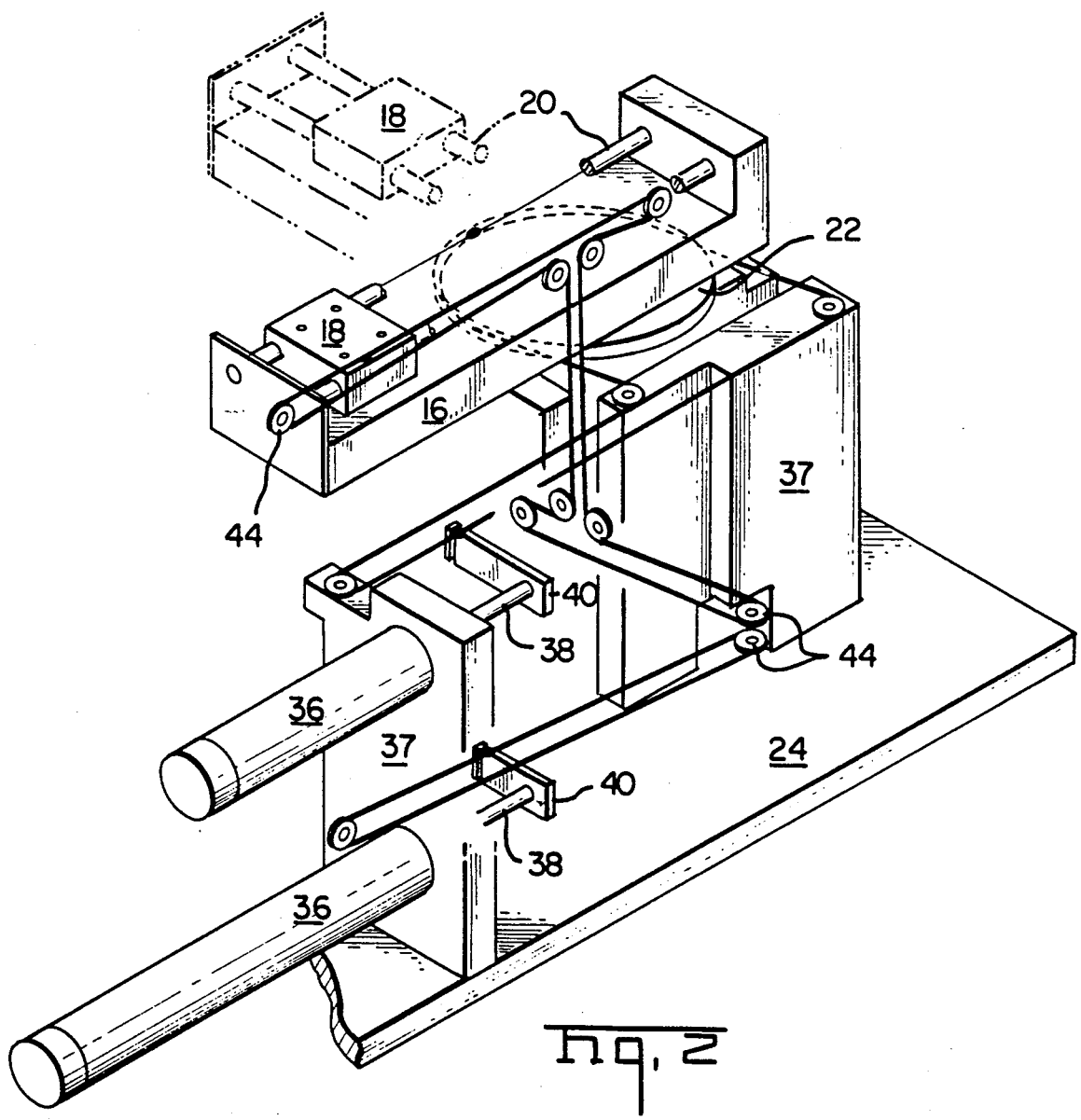
FIG. 2 is an isometric schematic of the cable hook-up and pulley routing arrangement.
Figure 7:
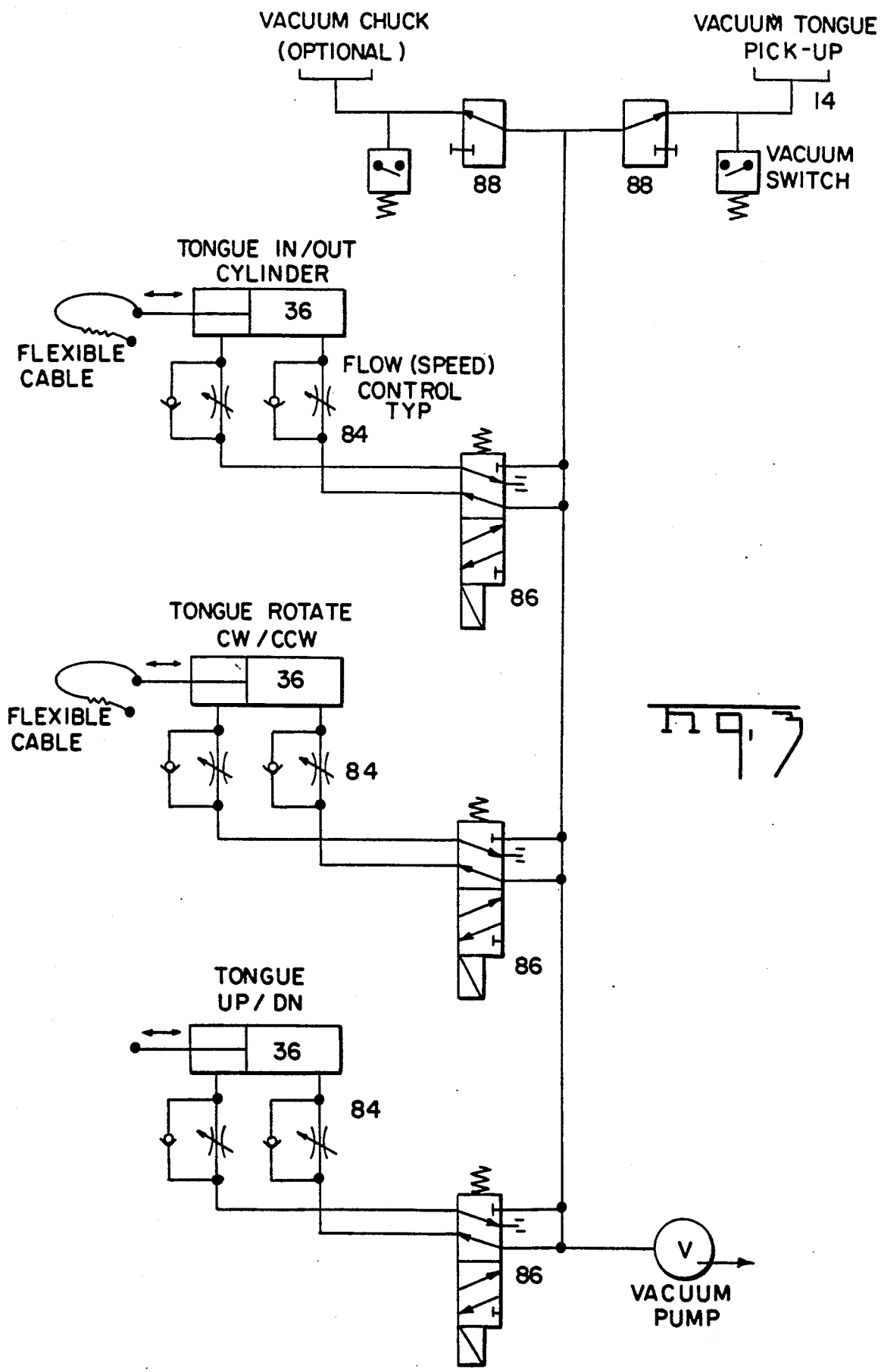

FIG. 2 shows the basic elements of the invention for both translational and rotational control systems. Air cylinders 36 respectively provide translating and rotating motions by means of pulleys 44 and cables 42. Pistons rods 38 driven by cylinders 36 are attached by connectors 40 directly to cables 42. Routing pulleys 44 and cables 42 provide motion of slide arm 50 over smooth rod supports 20. The translator base 16 holds rod supports 20 as well as the cable and pulley assembly to produce controlled back and forth motion of the slide 18. Routing pulleys 44 and cable 42 provide rotation of the translator base by means of drum 22. A broken rotated view is shown in phantom. Vertical support blocks 37 hold the assembly together for proper spacing and operation, while base plate 24 supports the entire system.

FIG. 3 is a fluidic schematic which gives the connection of vacuum lines to cylinders. The vacuum pump 80 draws air from each cylinder 36 through flow speed controls 84 and valves 86. The pump 80 also provides vacuum to operate tongue 14 to pick-up wafers 12, as controlled by valve 88.

FIG. 4 is a pneumatic block diagram showing the flow of vacuum forces to the various control channels. The manifold 134 stores and routes the vacuum created by the pump 136, to all valve components 132 which under micro-processor control 122 are activated and directed by drivers 130. A series of sensor switches 146 provide the required input for most functions of control 122 while cassette size settings 148 supply other pertinent information. The keyboard terminal entry programs the operation of the control unit 122 according to desired parameters of operation. A lift or elevation control mechanism using a stepper motor 128 driver 126 and controller 124 is given as an example of one way to locate the cassette vertically.

Turning finally to FIG. 5, a vacuum powered lift mechanism is shown for precise elevation control of the wafer holding tongue assembly. Tongue 14 and support arm 150 are held by nut and bolt sets 156 attached through spring plate 152. Cylinder 160 which is bolted to support arm 150 produces motion of a rod element 162, in contact under spring tension, with carrier base plate 164. Spring plate 154 held in place by nut and bolt sets 158 produces tension for motions of rod element 162. Adjustment screw 166 is used to set limits in elevation motion. The entire assembly is supported by slide 18, held by the translator base 16 shown in FIG. 2. Extensions of the rod 162 against the carrier base plate 164, forces the upper assembly (including cylinder 160, support arm 150 and tongue 14) to lift in parallel motion to height, as allowed by adjustment screw 166 settings. A lift sense switch 168 provides feedback information for verification of lift.

Having described the presently preferred embodiments of the invention, it should be understood that various changes in construction and arrangement will be apparent to those skilled in the art and fully contemplated herein without departing from the true spirit of invention. Accordingly, there is covered all alternatives, modifications and equivalents as may be included within the spirit and scope of the invention as defined in the appended claims.

I claim:

1. A method using a first and a second vacuum operated gas cylinder, connected cable drives, connected slide arm and connected rotating base to transfer material in an ultraclean environment comprising:
    applying a first vacuum to a first side of the first gas cylinder;
    applying a second vacuum that is of greater magnitude than the first vacuum to a second side of the first gas cylinder;
    allowing a rod of the first gas cylinder to move a connected cable drive a distance defined by a stroke of the slide arm on smooth rod supports; and
    activating a vacuum force to a tongue supported by the side arm to pick up a wafer from a cassette;
    causing the second vacuum of the first gas cylinder to decrease in magnitude below that of the first vacuum of the first gas cylinder;
    allowing a rod of the first gas cylinder to move the connected cable drive a distance defined by a reverse stroke of the side arm on smooth rod supports;
    applying a first vacuum to a first side of the second gas cylinder;
    applying a second vacuum that is of greater magnitude than the first vacuum to a second side of the second gas cylinder;
    allowing a rod of the second gas cylinder to move the connected cable drive a distance defined by a rotational arc of a pulley connected to the rotating base of the slide arm on smooth rod supports, thus rotating the slide arm and the tongue from the cassette to an inspection station:
    releasing the vacuum force to the tongue to place the wafer on the inspection station; and
    retracting the slide arm and tongue from the inspection station.

2. The method of claim 1 in which retracting the slide arm and tongue is accomplished by applying a second vacuum that is of greater magnitude that the first vacuum to a second side of the first gas cylinder thereby allowing the rod of the first gas cylinder to move the connected cable drive which moves the slide arm and tongue linearly away from the inspection station.

3. The method of claim 1 in which retracting the slide arm and tongue is accomplished by causing the second vacuum of the second gas cylinder to decrease in magnitude below that of the first vacuum of the second gas cylinder thereby allowing the second gas cylinder to move the connected cable drive a reverse distance defined by the rotational arc of the pulley connected to the rotating base of the slide arm and tongue and rotating the slide arm and tongue away from the inspection station.

4. The method of claim 1 which further comprises returning the slide arm and tongue to the inspection station;
    activating the vacuum force to the tongue to pick up a wafer from the inspection station;
    retracting the slide arm and tongue from the inspection manipulating the vacuum force to the first and second gas cylinders to move the wafer back to the cassette; and
    releasing the vacuum force to the tongue to place the wafer back in the cassette.

* * * * *